United States Patent
Yamada

[11] Patent Number: 5,874,783
[45] Date of Patent: Feb. 23, 1999

[54] SEMICONDUCTOR DEVICE HAVING THE INNER END OF CONNECTOR LEADS DISPLACED ONTO THE SURFACE OF SEMICONDUCTOR CHIP

[75] Inventor: Etsuo Yamada, Tokyo, Japan

[73] Assignee: Oki Electric Industry Co., Ltd., Tokyo, Japan

[21] Appl. No.: 900,469

[22] Filed: Jul. 25, 1997

Related U.S. Application Data

[63] Continuation of Ser. No. 664,548, Jun. 17, 1996, abandoned.

[30] Foreign Application Priority Data

Jun. 21, 1995  [JP]  Japan  ................................. 7-178296

[51] Int. Cl.$^6$ .......................... H01L 23/48; H01L 23/28; H01L 23/29
[52] U.S. Cl. .......................... 257/778; 257/787; 257/673; 257/692; 257/698; 257/635
[58] Field of Search .................................. 257/778, 787, 257/788, 672–674, 676, 692, 698, 696, 635, 636, 647, 669

[56] References Cited

U.S. PATENT DOCUMENTS

| | | | |
|---|---|---|---|
| Re. 35,109 | 12/1995 | Kubota et al. ........................ | 257/676 |
| 5,221,642 | 6/1993 | Burns . | |
| 5,229,639 | 7/1993 | Hansen et al. ........................ | 257/692 |
| 5,252,853 | 10/1993 | Michii ................................. | 257/666 |
| 5,334,803 | 8/1994 | Yamamura et al. .................... | 257/692 |
| 5,363,279 | 11/1994 | Cha ..................................... | 257/692 |
| 5,406,028 | 4/1995 | Beng et al. ............................ | 257/692 |
| 5,428,247 | 6/1995 | Sohn et al. ............................ | 257/676 |
| 5,519,251 | 5/1996 | Sato et al. ............................. | 257/787 |
| 5,530,286 | 6/1996 | Murakami et al. .................... | 257/692 |
| 5,545,921 | 8/1996 | Conru et al. ........................... | 257/674 |

FOREIGN PATENT DOCUMENTS

| | | | |
|---|---|---|---|
| 04044347 | 2/1992 | Japan . | |
| 04320390 | 11/1992 | Japan . | |
| 05152495 | 6/1993 | Japan . | |
| 0347374 | 12/1993 | Japan ................................. | 257/676 |
| 0216282 | 8/1994 | Japan ................................. | 257/676 |
| 07335818 | 12/1995 | Japan . | |

*Primary Examiner*—Tom Thomas
*Assistant Examiner*—Alexander Oscar Williams
*Attorney, Agent, or Firm*—Rabin, Champagne, & Lynt, P.C.

[57] ABSTRACT

A semiconductor device includes connector leads which have an offset portion supported by the primary surface of a semiconductor chip on which electronics circuitry is formed into an integrated circuit. The offset portion is disposed near the contact pads for connecting the electronics circuitry. The remaining portion of the connector leads far from the contact pads is spaced from the primary surface by an adhesive strip of electrically insulative material. Bonding wires connect the connector leads to the contact pads. The total thickness of the package is reduced to accomplish a thinner and flatter semiconductor device.

17 Claims, 3 Drawing Sheets

SEMICONDUCTOR DEVICE HAVING THE INNER END OF CONNECTOR LEADS DISPLACED ONTO THE SURFACE OF SEMICONDUCTOR CHIP

This application is a continuation of application Ser. No. 08/664,548, Filed Jun. 17, 1996 (now abandoned).

BACKGROUND OF THE INVENTION

1. Field of the Invention

The present invention relates to a semi-conductor device comprising a semiconductor chip on which electronics circuitry is formed into an integrated circuit (IC) and a package enclosing the semiconductor chip therein.

2. Description of the Background Art

The type of package molded with synthetic resin, electrically insulative, for enclosing an integrated circuit therein is advantageous in compactness and easy handling. A sort of synthetic resin package for an integrated circuit is known as the thin small outline package (TSOP). The thin small outline package includes a semiconductor chip having a primary surface on which contact pads are formed and in parallel to which connector leads extend outwards with the end portion thereof, nearer to the contact pads, secured on the primary surface by means of electrically insulative, adhesive strips. The contact pads are connected by bonding wires with the connector leads. The connecting portions of the bonding wires and the connector leads are encapsulated and sealed by a synthetic resin package together with the entire semiconductor chip. The electronics circuitry formed on the semiconductor chip is interconnected to the contact pads, which are electrically interconnected to the connector leads through the bonding wires. The electronics circuitry may ultimately be interconnected to a utility device, which will be coupled to the connector leads.

With the type of comiconductor device mentioned above, the bonding wires bonded to the contact pads formed on the primary surface of the semiconductor chip and the ends of the connector leads have such a sufficient length as to form an arc between the contact pads and the bonded ends of the connector leads. The bonded end portions of the connector leads are at the height, from the primary surface of the semiconductor chip, which height is substantially equal to the sum of the thickness of the adhesive strip and the thickness of the connector lead. The arcuate portion of the bonding wires extends over the height. That part of the synthetic resin package which covers the bonded end portions of the connector leads and the contact pads has to be of the thichness which is sufficiently longer than the height of the peak of the arc from the primary surface of the semiconductor chip. That requirement is a hindrance to minimizing the thickness of the synthetic resin package of a semiconductor device, and hence producing a compacter, or thinner, semiconductor device.

SUMMARY OF THE INVENTION

It is therefore an object of the present invention to provide a semiconductor device which has a thinner or flatter package for enclosing a semiconductor chip.

In accordance with the present invention, a semiconductor device includes connector leads which have an offset portion supported by the primary surface of a semiconductor chip on which electronics circuitry is formed into an integrated circuit. The offset portion is disposed near the contact pads for connecting the electronics circuitry. The remaining portion of the connector leads far from the contact pads is spaced from the primary surface by a supporting member of electrically insulative material. Bonding wires connect the connector leads to the contact pads.

More specifically, in accordance with an aspect of the invention, a semiconductor device comprises: a semiconductor chip having a primary flat surface on part of which electronics are formed in a form of integrated circuit and contact pads are formed to electrically interconnect the electronics; connector leads extending in a direction from said contact pads to a periphery of said semiconductor chip for connecting said contact pads to a utility device; and bonding wires connecting said connector leads to said contact pads; said connector leads comprising an offset portion which is supported by the primary surface of said semiconductor chip and disposed near said contact pads, a remaining portion of said connector leads which is far from said connector pads being spaced from the primary surface of said semiconductor chip in a direction normal to the primary surface of said semiconductor chip.

BRIEF DESCRIPTION OF THE DRAWINGS

The objects and features of the present invention will become more apparent from consideration of the following detailed description taken in conjunction with the accompanying drawings in which.

DESCRIPTION OF THE PREFERRED EMBODIMENTS

Figure 1:
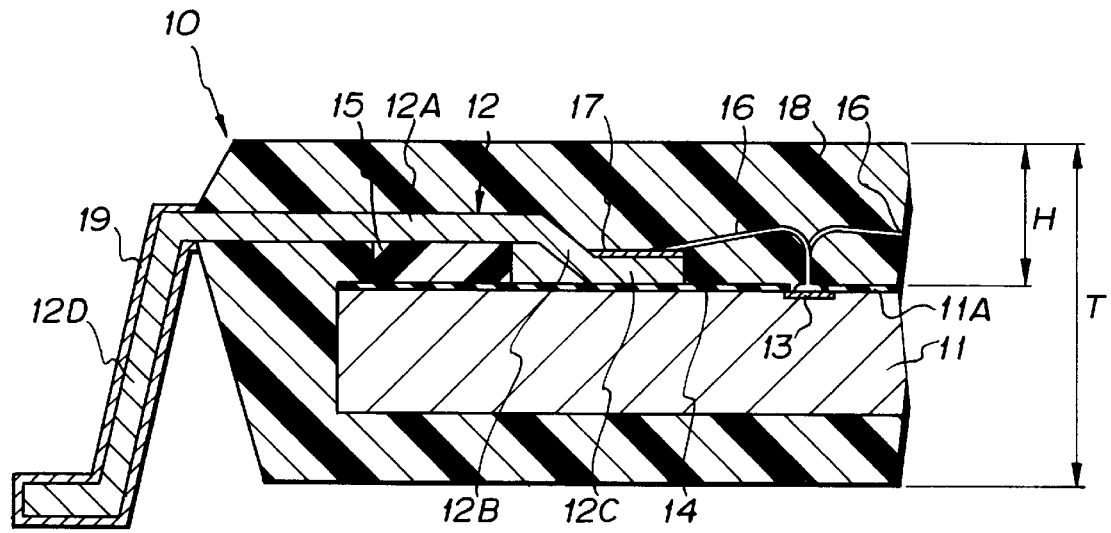
FIG. 1 is a schematic, partial and vertical cross-sectional view of a preferred embodiment of a semiconductor device in accordance with the present invention.
Figure 4:
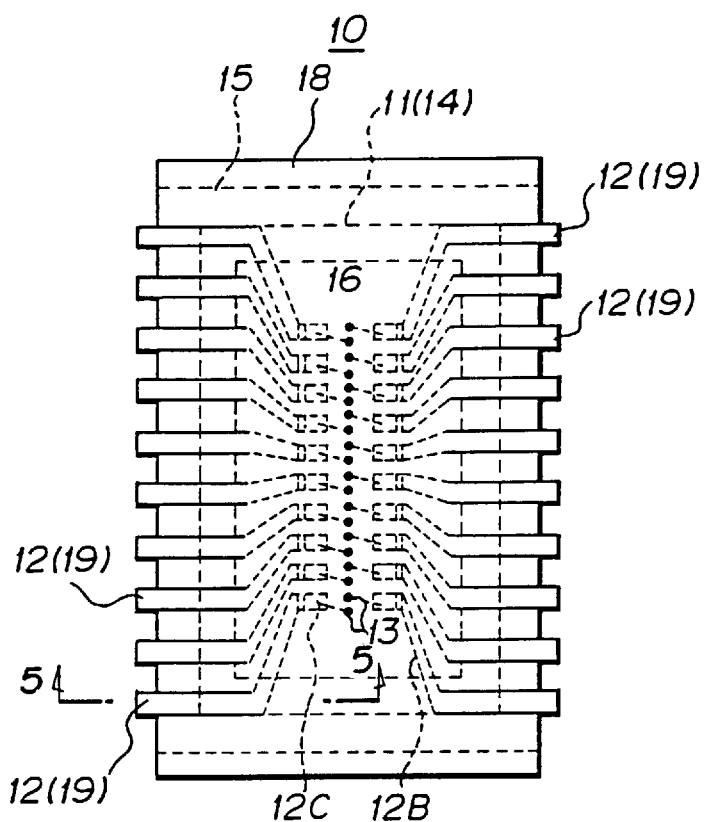
FIG. 4 is a schematic top view showing a further alternative embodiment of a semiconductor device in accordance with the present invention.

With reference to FIG. 1, a preferred embodiment of a semiconductor device 10 in accordance with the present invention may be implemented as a DRAM (dynamic random-access memory) of 16 Mbits, for example. The semiconductor device 10 includes a semiconductor chip 11 on which electronics circuits are formed on a semiconductor substrate to establish an integrated circuit (IC) in the form of the thin small outline package (TSOP). The outline of the top view of the semiconductor device 10 may be similar to, but slightly different from, what is shown in FIG. 4. Returning to FIG. 1, the semiconductor device 10 also includes connector leads 12, one of which is shown in the figure only for simplicity. The semiconductor chip 11 has a generally flat, primary surface 11A on which contact pads 13 are formed to connect connector leads to the electronics included in the integrated circuit. Also, one of the contact pads is shown in the figure only for simplicity. The portions of the primary surface 11A of the chip 11 except the portions in which the contact pads 13 are provided are covered with an electrically insulative and protective layer 14, made of a synthetic resin, such as polyimide series material, of approximately 5–15 μm thick, for example.

The connector leads 12 are made of a generally elongate strip of electrically conductive material or metal, and generally horizontally extend outwards from the peripheral edges of the semiconductor chip 11. Advantageously, the conductive leads 12 may be made of a resilient material. The conductor leads 12 have a central portion 12A which is secured by an adhesive strip 15 on the primary surface 11A of the chip, as seen from FIG. 1. The adhesive strip 15 comprises a film made of a synthetic resin material, such as polyimide series, and has opposite flat surfaces covered with an adhesive agent, such as of a synthetic resin, for example, epoxy or polyimide series. Adhesive materials which can be melt with heat are advantageously used. The central portion 12A of the connector leads 12 is thus spaced from the open surface of the protective layer 14 with a distance substantially equal to the thickness of the adhesive strip 15. The central portion 12A of the connector leads 12 thus extends outwards from the contact pads 13 to the edge of the chip 11.

The invention is not restricted to the use of the adhesive strip 15. Alternatively, liquid adhesive agent may be applied which is solidified with heat. It is advantageous to space the central portion 12A of the connector leads 12, from the top surface of the protective layer 14 in the direction normal to the horizontal plane formed by the primary surface 11A of the semiconductor chip 11, by a predetermined distance in terms of the capacitance. In that sense, the adhesive strip 15 of the type thus described is more preferable.

The connector leads 12 have another portion 12B continuous from the central portion 12A toward the contact pads 13. As clearly shown in FIG. 1, the portion 12B extends from the inner edge of the adhesive strip 15 and is bent or curved downwards in the figure. Due to this specific elevated view of the portion 12B, it is referred to as a step portion.

Further continuous from the step portion 12B, the connector leads 12 have an offset portion 12C which is in contact with part of the flat surface of the insulative and protective layer 14 with the extreme thereof terminated with a certain distance left before the contact pads 13. The offset or displacing of the offset portion 12C corresponds to the space from the open surface of the protective layer 14, namely, to the thickness of the adhesive strip 15. Due to that fact and since the conductive leads 12 are resilient, the offset portion 12C is biased downwards in the figure by supporting the lower surface of the central portion 12A by the adhesive strip 15 on the protective layer 14 so as to be pressed against the top surface of the insulative and protective layer 14. The insulative and protective layer 14 functions as relaxing or absorbing the pressure caused by the biasing of the portions 12B and 12C, as well as the impact which may be imposed when bonding wires 16, described later, are bonded to the offset portion 12C, so as to protect the primary surface of the chip 11 from being damaged. The top surface of the offset portion 12C is plated with silver to form a silver layer 17.

The connector leads 12 is coupled to the contact pads 13 by the bonding wires 16 to electrically interconnect both of them. The bonding wires 16 have one end thereof bonded to the conductor leads 12 at the offset portion 12C thereof covered with the silver layer 17. The silver layer 17 advantageously serves as facilitating the thermo compression bonding of the one end of the bonding wires 16 to the offset portions 12C by means of ultrasonic waves, for example. The bonding wires 16 have the other end coupled to the contact pads 13.

The whole structure of the semiconductor chip 11 carrying the integrated circuits thereon and the contact pads 13 together with the portions 12B and 12C of the connector leads 12 and bonding wires 16 are, as illustrated in the figure, encapsulated and sealed by a package 18 molded. The package 18 is advantageously made of electrically insulative, synthetic resin or plastic material, such as epoxy series including fibrous silica having the thickness of about 60–100 μm, for example. In general, the package 18 is advantageously molded by using upper and lower molds, not shown, which may be abutted against each other. During molding, both of the molds are pressed against each other to firmly form the mold package 18. The adhesive strips 15, provided on the insulative and protective layer 14, function as absorbing and relaxing the pressure and impact which may be imposed during the molding and would otherwise damage or crack the semiconductive chip 11.

Alternatively, the invention is also applicable to other types of package, such as a ceramic type of package and a metallic type of package which have a cavity formed therein side to encapsulate the semiconductor chip 11 and the associated components.

The connector leads 12 have the other end portions 12D thereof which extend outwards from the periphery of the package 18. The end or leg portions 12D of the connector leads 12 may ultimately be coupled to a utility device, and are generally bent downwards in the figure. For facilitating the connection of the end portions 12D, the end portions 12D extending from the package 18 are plated with gold to form a gold layer 19. The electronics included in the semiconductor device 10 will be coupled to a utility device via the connector leads 12, bonding wires 16 and contact pads 13.

With the illustrative embodiment shown in and described above with reference to FIG. 1, the semi-conductor device 10 has the bonding wires 16 coupled to the offset portions 12C of the connector leads 12. As described earlier, the offset portion 12C of the connector leads 12 displaces or is offset from the level of the central portion 12A toward the protective layer 14 covering the primary surface 11A of the chip 11 by the height corresponding to the thickness of the adhesive strip 15. This results in lowering the height of the offset portions 12C.

More specifically, as seen from FIG. 1, the bonding wires 16 have such a sufficient length as to form an arc between the contact pads 13 and the offset portions 12C of the connector leads 12. The arcuate portion of the bonding wires 16 has its peak lowered accordingly, i.e. by the distance corresponding to the thickness of the adhesive strip 15. As shown in the figure, the peak of the arc of the bonding wires 16 is lower than the top surface of the central portion 12A of the connecting leads 12, e.g. approximately 0.225–0.25 milimeters high above the top surface of the protective layer 14. The upper part of the synthetic resin package 18 entirely covering the central portion 12A of the connector leads 12 and the bonding wires 16 may be of the thickness H which is sufficiently longer than the height of the top surface of the central portion 12A, rather than the peak of the arc in the conventional device, from the top surface of the protective layer 14 formed on semiconductor chip 11. The thickness H of the upper part of the package 18 is substantially reduced in comparison with the prior art, so that the total thickness T of the package 18 will be reduced accordingly to about one millimeter, for example. This gives rise to accomplishing a thinner and flatter semiconductor device 10.

Alternatively, the offset portion 12C may be located in another place, for example, in place of the central portion 12A of the connector leads 12. However, the FIG. 1 embodiment is more advantageous in that because the offset portion 12C provided at the end portion of the connecting leads 12 nearer to the contact pads 13 functions also as a bonding pad, which is more advantageous in the vicinity of the contact pads 13 so that it allows the length of bonding wires 16 to be reduced than provided in the middle of the length of the connector leads 12. The provision of the offset portion 12C at the tip of the leads 12 near the pads 13 will also contribute to minimizing the mass of the package 18.

Figure 2:
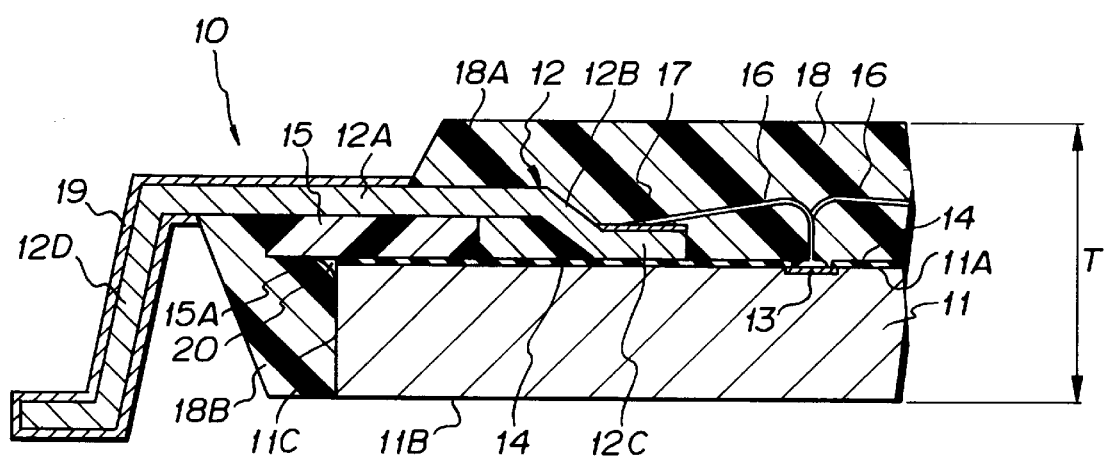
FIG. 2 is a schematic, partial and vertical cross-sectional view, similar to FIG. 1, showing an alternative embodiment of a semiconductor device in accordance with the present invention.

With reference to FIG. 2, the semiconductor device 10 in accordance with an alternative embodiment of the invention is similar to what is shown and described with reference to FIG. 1 except that the other primary surface, or back surface, 11B is exposed to the ambient atmosphere in order to enhance the radiation of heat generated from the integrated circuits incorporated in the device 10. In the figures, like components are denoted with the same reference numerals as shown in FIG. 1.

In general, with the type of semiconductor device with its back surface of the semiconductor chip exposed, the synthetic resin package may sometimes have flashes caused by extra molding material extruded from a mold used. Such flashes may often reduce the efficiency in radiating the extra heat from the integrated circuits.

In accordance with the embodiment shown in FIG. 2, the synthetic resin package 18 comprises an upper package half 18A which is advantageously smaller in horizontal area than the primary surface 11A of the semiconductor chip 11 in order to prevent extra part of the plastic material used to form the package half 18A, while molding, from expanding from the mold used to the back surface 11B.

In addition, the adhesive strips 15 extend or protrude outwards, or horizontally in the figure, from the periphery 11C of the semiconductor chip 11. The adhesive strips 15 will be heated to be fixed on the protective layer 14, so that the extended portion of the strips 15 is secured at its back surface 15A by a fillet 20, which is formed by a part of the adhesive agent coating the strips 15 and was overflown, when heated, to seal the boundary area between the back surface of the strips 15A and the vertical edge 11C of the chip 11. The fillet 20 also functions as preventing the edge portion 11C of the chip 11 from being cracked due to the periodically changing temperature applied by test after the semiconductor device 10 has been completed. The peripheral portion 18B of the chip 11 is covered with the material of synthetic resin 18B to form the package 18.

As described above, the FIG. 2 embodiment has its back surface 11B open to the air to promote the radiation of heat generated from the integrated circuits in the device 10. The back surface is not covered with a synthetic resin layer, resulting in advantageously reducing the total thickness of the package 18 and establishing a thinner and flatter semiconductor device.

Figure 3:
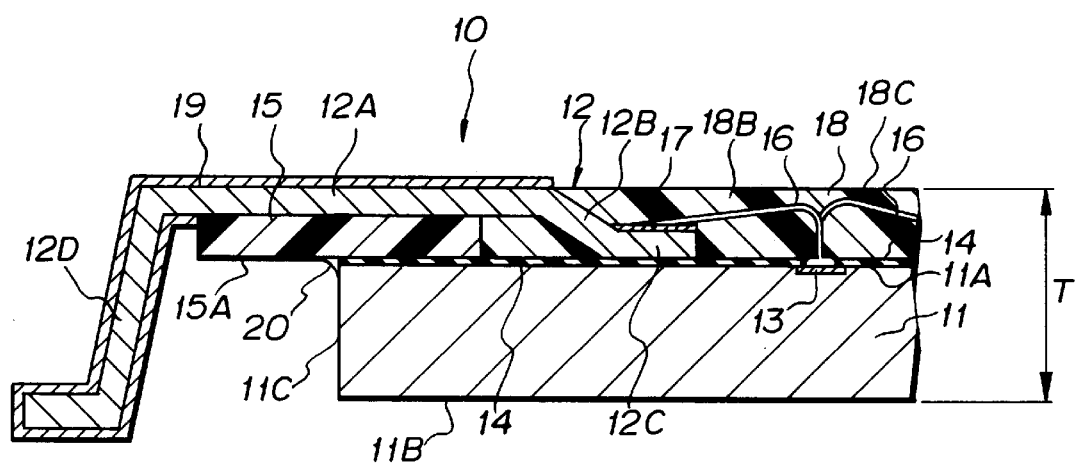
FIG. 3 is also a schematic view showing a vertical cross section of part of a still another alternative embodiment of a semiconductor device in accordance with the present invention.

With reference to FIG. 3, the semiconductor device 10 in accordance with a further alternative embodiment of the invention is similar to what is shown and described with reference to FIG. 2 except that the peripheral surface 11C of the chip 11 is also exposed to the ambient atmosphere without being covered by part of the package 18, as well as the package half 18B has a generally flat top surface 18C substantially at the same level as the top surface of the central portion 12A of the connector leads 12. The uncovered surface 11C, together with the also uncovered back surface 11B, serves as radiating a portion of the heat generated from the electronics included in the device 10.

Additionally, the top surface 18C of the package half 18B is substantially at the same level as the top surface of the central portion 12A of the connector leads 12. The step portion 12B, the offset portion 12C continuing the step portion 12B, bonding wires 16 and the contact pads 13 are, of course, still maintained embedded in the synthetic resin layer of the package 18. This structure permits the thickness T of the semiconductor device 10 will further be reduced to achieve a compacter device.

Referring to FIG. 4, a still another embodiment of the semiconductor device according to the intention is similar to what is shown and described with reference to FIGS. 1, 2 and 3 except that it is not provided with a portion of the leads 12 which corresponds to the end or leg portions 12D. This structure of the leads 12 is most apparently understood from FIG. 5. The FIGS. 4 and 5 embodiment 10 has the central portions 12A of the connector leads 12 exposed from the package 18 and aligned in a couple of lines. The exposed surface of the gold-plated layer 19 of the leads 12 will be used to directly be coupled to a utility device by means of the bump type of contact pads, for example.

Figure 5:
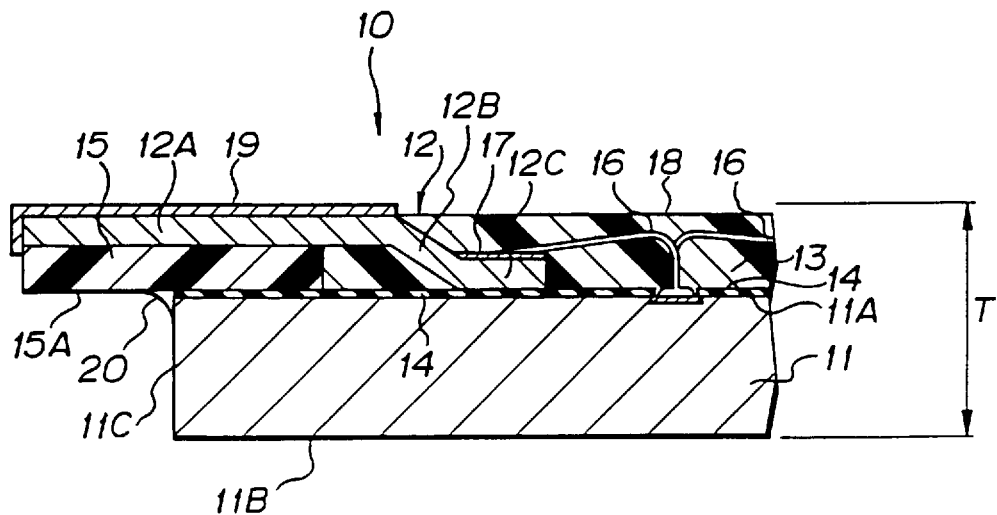
FIG. 5 schematically shows a cross section, along line V—V in FIG. 4, of part of the embodiment shown in FIG. 4.

With the embodiment shown in FIGS. 4 and 5, the back and peripheral surfaces 11B and 11C thus uncovered and exposed to the atmosphere function as radiating a substantial portion of the heat generated from the electronics included in the device 10. Additionally, the omission of the a portion of the leads 12 which corresponds to the leg portions 12D extending downwards below the level of the primary surface of the chip 11 permits the semiconductor device 10 to be thinner, establishing an extensively thin semiconductor device having the thickness of less than 0.5 millimeters, for example.

While the present invention has been described with reference to the particular illustrative embodiments, it is not to be restricted by those embodiments. It is to be appreciated that those skilled in the art can change or modify the embodiments without departing from the scope and spirit of the present invention.

What I claim is:

1. A semiconductor device comprising:

a semiconductor chip having a primary flat surface on part of which electronics are formed in the form of an integrated circuit, and having contact pads disposed on the primary surface for electrically interconnecting the electronics;

an insulative layer formed on part of the primary surface of the semiconductor chip with the contact pads exposed:

connector leads extending in a direction from said contact pads to a periphery of said semiconductor chip for connecting said contact pads to a utility device, said connector leads comprising an offset portion which is disposed near said contact pads on said insulative layer, and a remaining portion which is distant from said contact pads and extends to the periphery of said semiconductor chip at a level higher in a direction normal to the primary surface than said insulative layer;

bonding wires connecting said connector leads to said contact pads; and a supporting member disposed between the remaining portion and said insulative layer for fixing the remaining portion to said insulative layer.

2. A semiconductor device in accordance with claim 1, wherein said supporting member is made of an electrically insulative material said supporting member being disposed outwards from said contact pads with said offset portions located between said contact pads and said supporting members to form an end of said connector leads.

3. A semiconductor device in accordance with claim 2, wherein said supporting member is in a form of a strip having opposite flat surfaces covered with an adhesive agent.

4. A semiconductor device in accordance with claim 1, further comprising a package made of an electrically insulative material for encapsulating therein at least part of said semiconductor chip, said contact pads, the offset portion of said connector leads and said bonding wires.

5. A semiconductor device in accordance with claim 4, wherein said package has a generally flat surface which is above a level of a top surface of the remaining portion of said connector leads in a direction normal to the primary surface of said semiconductor chip.

6. A semiconductor device in accordance with claim 4, wherein said bonding wires have a peak in a direction normal to the primary surface of said semiconductor chip, the peak not being above a level of a top surface of the remaining portion of said connector leads in a direction normal to the primary surface.

7. A semiconductor device in accordance with claim 6, wherein said package has a generally flat surface which is substantially at the same level as a level of a top surface of the remaining portion of said connector leads in a direction normal to the primary surface of said semiconductor chip.

8. A semiconductor device in accordance with claim 4, wherein said semiconductor chip has a back surface, opposite to the primary surface, exposed from said package to an ambient atmosphere.

9. A semiconductor device in accordance with claim 4, wherein said semiconductor chip has a peripheral surface exposed from said package to an ambient atmosphere.

10. A semiconductor device in accordance with claim 1, wherein said connector leads have a step portion continuous from the offset portion to bias the offset portion against the primary surface of said semiconductor chip.

11. A semiconductor device in accordance with claim 10, wherein said connector leads are made of a resilient material.

12. A semiconductor device in accordance with claim 1, wherein said connector leads have a leg portion for connecting the utility device.

13. A semiconductor device in accordance with claim 4, wherein said semiconductor device is of the type of thin small outline package (TSOP).

14. A semiconductor device comprising:
   a semiconductor chip having a primary surface on which a plurality of contact pads are formed;
   an insulative layer formed on part of the primary surface excepted from the plurality of contact pads;
   a supporting member formed on the insulative layer; and
   a plurality of leads each having a first portion fixed to the insulative layer by the supporting member to be supported at a first level, and a second portion continuous from the first portion and disposed near the plurality of contact pads at a second level substantially equal to the level of the insulative layer, the first level being higher in a direction normal to the primary surface than the second level.

15. A semiconductor device in accordance with claim 14, wherein the supporting member is in the form of a strip having opposite flat surfaces covered with an adhesive agent.

16. A semiconductor device in accordance with claim 14, further comprising a package made of an electrically insulative material for encapsulating therein at least part of the semiconductor chip, the plurality of contact pads, and the respective second portions.

17. A semiconductor device in accordance with claim 16, wherein the package has a generally flat surface which is above a level of a top surface of the respective second portions in a direction normal to the primary surface of the semiconductor chip.

* * * * *